United States Patent [19]
Nakakura

[11] Patent Number: 5,446,410
[45] Date of Patent: Aug. 29, 1995

[54] SEMICONDUCTOR INTEGRATED CIRCUIT

[75] Inventor: Yasuhiro Nakakura, Osaka, Japan

[73] Assignee: Matsushita Electric Industrial Co., Ltd., Osaka, Japan

[21] Appl. No.: 47,493

[22] Filed: Apr. 19, 1993

[30] Foreign Application Priority Data

Apr. 20, 1992 [JP] Japan .................. 4-099233

[51] Int. Cl.⁶ ........................... H01L 29/44
[52] U.S. Cl. .................. 327/565; 257/211; 257/758
[58] Field of Search ......... 307/269, 303, 303.1, 307/303.2; 328/55; 257/207, 211, 758, 773

[56] References Cited

U.S. PATENT DOCUMENTS

| | | | |
|---|---|---|---|
| 3,808,475 | 4/1974 | Buelow | 317/235 R |
| 4,337,433 | 6/1982 | Yoshimura | 328/55 |
| 4,926,066 | 5/1990 | Maini et al. | 307/303.1 |
| 5,084,414 | 1/1992 | Manley et al. | 437/189 |
| 5,122,679 | 6/1992 | Ishii et al. | 307/269 |
| 5,140,184 | 8/1992 | Hamamoto et al. | 307/269 |
| 5,148,263 | 9/1992 | Hamai | 357/71 |
| 5,258,660 | 11/1993 | Nelson et al. | 307/597 |
| 5,270,592 | 12/1993 | Takahashi et al. | 307/303 |
| 5,291,043 | 3/1994 | Araka | 257/211 |
| 5,294,837 | 3/1994 | Takase et al. | 257/758 |

FOREIGN PATENT DOCUMENTS 64-57736  3/1989  Japan .
1-289155  11/1989  Japan .

Primary Examiner—Steven L. Stephan
Assistant Examiner—Shawn Riley
Attorney, Agent, or Firm—William Brinks Hofer Gilson & Lione

[57] ABSTRACT

Provided on the periphery of a semiconductor chip are a clock input pad 10 and a clock driver 11. Clock pulse generators 13A to 13G are provided to functional blocks 12A to 12F. A clock signal line 14, through which clock signals are transmitted to the clock pulse generators 13A to 13G, is composed of a first clock line 14a extending from the clock driver 14 to the center of the semiconductor chip, and a plurality of second clock lines branching, at the center of the semiconductor chip, from the leading end of the first clock line to extend to the clock pulse generators 13A to 13G respectively.

3 Claims, 8 Drawing Sheets

SEMICONDUCTOR INTEGRATED CIRCUIT

BACKGROUND OF THE INVENTION

This invention relates to a semiconductor integrated circuit containing plural functional blocks.

As the density of components on semiconductor integrated circuits and the speed of operation increase, the size of semiconductor chips and power consumption increase. Accordingly, it is increasingly becoming important that functional blocks in a semiconductor integrated circuit are stably fed clock pulses and electric current.

In a conventional semiconductor integrated circuit having a multi-level metal interconnect-wiring configuration, there are no interconnect-wiring limitations in a metal interconnect-wiring layer, and it is so intended that the area occupied by metal interconnect-wirings connected to functional blocks is reduced to a minimum.

A first conventional semiconductor integrated circuit is explained. A clock signal line and a power supply line of such a circuit are detailed.

Figure 10:
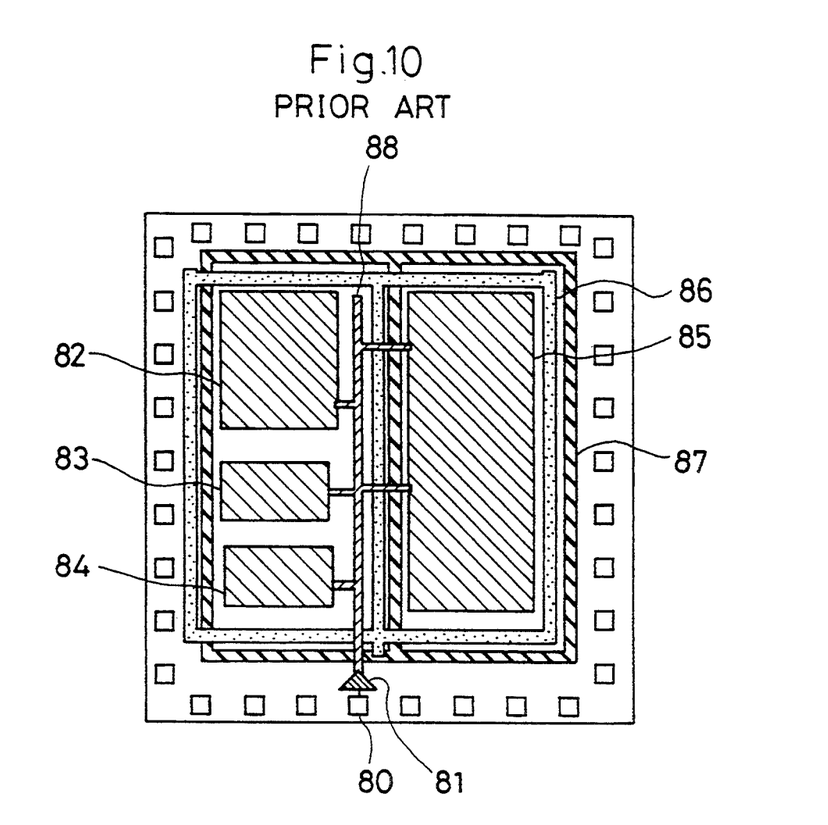
FIG. 10 is a schematic interconnect-wiring diagram of the foregoing first conventional semiconductor integrated circuit.

FIG. 10 is an illustration showing a clock signal line and a power supply line in a conventional semiconductor integrated circuit. A clock input pad, indicated by reference numeral 80, is provided on the periphery of a semiconductor chip. A clock driver, indicated by reference numeral 81, is provided, which locates next to the clock input pad 80. Functional blocks, indicated by reference numerals 82, 83, 84, and 85, are provided in the semiconductor chip, each functional block containing a clock pulse generator. A $V_{DD}$ power supply line is indicated by reference numeral 86. A $V_{SS}$ power supply line (ground) is indicated by reference numeral 87. A clock signal line, indicated by reference numeral 88, is a transmission line through which clock signals sent out from the clock driver 81 are transmitted to the clock pulse generators in the functional blocks 82, 83, 84, and 85.

In the above-described semiconductor integrated circuit, the clock signal line 88 has priority of interconnect-wiring over other signal lines, which allows the clock signal line 88 to run to a clock pulse generator by shortest.

However, in the first conventional semiconductor integrated circuit, the area occupied by a power supply line or a clock signal line becomes greater as the density of components on a semiconductor chip becomes higher. Additionally, a clock signal line lengthens as the size of a semiconductor chip increases. This causes a greater difference in the interconnect-wiring length of a clock signal line, between functional blocks. The clock skew between functional blocks becomes serious, accordingly.

In accordance with this prior art technique, an uppermost-level metal interconnect-wiring layer is provided with signal lines of the functional blocks 82, 83, 84, and 85, in addition to the clock signal line 88, the $V_{DD}$ power supply line 86, and the $V_{SS}$ power supply line 87. For the case of a semiconductor integrated circuit having a multi-level interconnect-wiring layer, the metal interconnect-wiring of an upper-level layer is likely to be damaged due to the difference in film thickness of the metal interconnect-wiring of a lower-level layer. This presents a drawback that the fabrication of semiconductor integrated circuits with a multi-level metal interconnect-wiring layer is difficult.

Japanese Patent Application, published under No. 64-57736, discloses a second conventional semiconductor integrated circuit.

This semiconductor integrated circuit intends to reduce the value of resistance of a clock signal line of the foregoing first conventional semiconductor integrated circuit. In this semiconductor integrated circuit, an uppermost-level metal interconnect-wiring layer is exclusively used for the interconnect-wiring of a clock signal line. Such an upper-most-level layer is a non-etched, flat layer for the supply of clock signals.

Since, in the second conventional semiconductor integrated circuit, a non-etched flat layer constitutes a clock signal line, this reduces the value of resistance thereof. However, the capacitance of interconnect-wiring is over 500 times that of the prior art interconnect-wiring. More time and power are consumed to drive a clock signal. This prior art technique seems characterized in that it requires no etching steps in processing. However, an external input pad must be provided on an uppermost-level layer, which necessitates etching for distinguishing a clock signal line from an external input pad. Further, the power supply lines are not different from those in the prior art techniques so that the area of a semiconductor chip inevitably increases. Although the clock skew between functional blocks is canceled using the second conventional semiconductor integrated circuit, there are several disadvantages which prevent such a semiconductor integrated circuit from being put into practical applications.

Japanese Patent Application, published under No. 1-289155, discloses a third conventional semiconductor integrated circuit.

This third semiconductor integrated circuit employs a clock signal feed method. A single clock pulse generator is provided at the center of a semiconductor chip. A clock driver sends out clock signals to the single-provided clock pulse generator. Upon receiving a clock signal, the clock pulse generator directly drives each functional block. This semiconductor integrated circuit intends to reduce the clock skew between functional blocks by making the interconnect-wiring lengths from one clock pulse generator to each functional block almost equal.

The third conventional semiconductor integrated circuit, however, has some disadvantages. Although the arrangement of providing a single clock pulse generator at the center of a semiconductor chip produces the foregoing advantage that the interconnect-wiring lengths from on single clock pulse generator to each functional block become almost equal, it presents several problems that a greater voltage drop occurs since the distance between a clock pulse generator and a power pad lengthens. Furthermore, a logical circuit, which shares the same power supply line with the clock pulse generator, suffers noises, since only one clock pulse generator is provided thereby consuming much power and causing a voltage drop.

In this conventional semiconductor integrated circuit, the distance between a clock pulse generator and a functional block still stays lengthy so that the difference in distance between a clock pulse generator and a functional block is still existent. In consequence, the clock skew will not be suppressed effectively.

SUMMARY OF THE INVENTION

It is therefore a general object of the invention to provide an improved, practical semiconductor integrated circuit so as to reduce clock skew.

To achieve this object, the present invention discloses several improved semiconductor integrated circuits. In a first semiconductor integrated circuit of the present invention, functional blocks each contain a clock pulse generator, and a clock signal line, through which clock signals are transmitted to the clock pulse generators of the functional blocks, is so formed that it extends from a clock driver provided on the periphery of a semiconductor chip to the center of the semiconductor chip at which it branches and extends to each functional block.

More specifically, the first semiconductor integrated circuit is a semiconductor integrated circuit wherein a plurality of functional blocks are provided on top of a semiconductor chip formed on which periphery is a clock input pad. This semiconductor integrated circuit comprises (a) a clock driver for outputting a clock signal, which is provided on the periphery of the semiconductor chip and locates next to the clock input pad, (b) a plurality of clock pulse generators, which are provided within the functional blocks respectively, and (c) a clock signal line, through which clock signals fed from the clock driver are transmitted to the clock pulse generators, wherein the clock signal line is composed of a first clock line extending from the clock driver to the center of the semiconductor chip, and a plurality of second clock lines branching from the leading end of the first clock line at the center of the semiconductor chip to extend to the clock pulse generators respectively.

In accordance with the first semiconductor integrated circuit, a clock driver is provided on the periphery of a semiconductor chip, which locates next to a clock input pad. This shortens the distance between a clock input pad and a clock driver, thereby achieving a stable power supply to a clock driver and a noise reduction in other active elements.

Because of the provision of a clock pulse generator to each functional block, the degree of a drop in voltage in a clock pulse generator can be reduced. The occurrence of noises can be suppressed. Further, the clock overlap between functional blocks can be canceled. Since the interconnect-wiring length from a clock pulse generator to an active element in each functional block shortens, this reduces the difference in the interconnect-wiring length between a clock pulse generator and an active element. As a result, the clock skew taking place in each functional block can be reduced.

Since a clock signal line is formed by a first clock line and plural second clock lines in such a way as described above, this reduces the difference in interconnect-wiring length between second clock lines, and therefore the clock skew between functional blocks can be reduced.

In the first semiconductor integrated circuit, it is preferable that a first clock line has a greater line width than any of second clock lines.

This reduces the electric resistance in the first clock line, thereby resulting in the clock skew reduction between functional blocks.

In the first semiconductor integrated circuit, it is preferable that second clock lines have the same interconnect-wiring length.

This makes the interconnect-wiring lengths of clock signal lines from a clock driver to each functional block almost equal, thereby resulting in the clock skew reduction between functional blocks.

In a second semiconductor integrated circuit, particular one of metal interconnect-wiring layers of a multi-level is for the substantial exclusive use of a power supply line and a clock signal line, and is given greater design rules of lines and spaces, in order to reduce the value of resistance of a clock signal line and to make the interconnect-wiring length to each functional block equal.

More specifically, the second semiconductor integrated circuit is a semiconductor integrated circuit comprising a plurality of functional blocks provided on a semiconductor chip and a multi-level metal interconnect-wiring layer, wherein particular one of the metal interconnect-wiring layers is for the substantial exclusive use of a power supply line and a clock signal line through which clock signals are transmitted to the functional blocks, and the particular metal interconnect-wiring layer is given greater design rules for lines and spaces than the remaining metal interconnect-wiring layers.

This reduces the electric resistance of a clock signal line and the difference in interconnect-wiring length between clock signal lines, which results in reducing the clock skew between functional blocks.

In the second semiconductor integrated circuit, it is preferable that the foregoing particular metal interconnect-wiring layer is an uppermost-level layer in a semiconductor chip.

With this arrangement, it is possible to advantageously make the line width of a power supply line wider, and thus a stable power supply is obtained. Further, power supply lines and clock signal lines, both of which are less applicable to being subjected to automated interconnect-wiring steps, are arranged on an uppermost-level layer which is originally less applicable to being subjected to automated interconnect-wiring steps. This makes it possible to classify layers by step to distinguish an uppermost-level layer not subjected to automated interconnect-wiring steps from other lower-level layers subjected to automated interconnect-wiring steps. This simplifies automated interconnect-wiring processing.

In the second semiconductor integrated circuit, it is preferable that the foregoing particular metal interconnect-wiring layer is provided with no interconnect-wirings except for a power supply line and a clock signal line.

This much reduces the electric resistance of a clock signal line and the difference in interconnect-wiring length between clock signal lines, thereby remarkably reducing the clock skew between functional blocks.

DETAILED DESCRIPTION OF THE INVENTION

Figure 1:
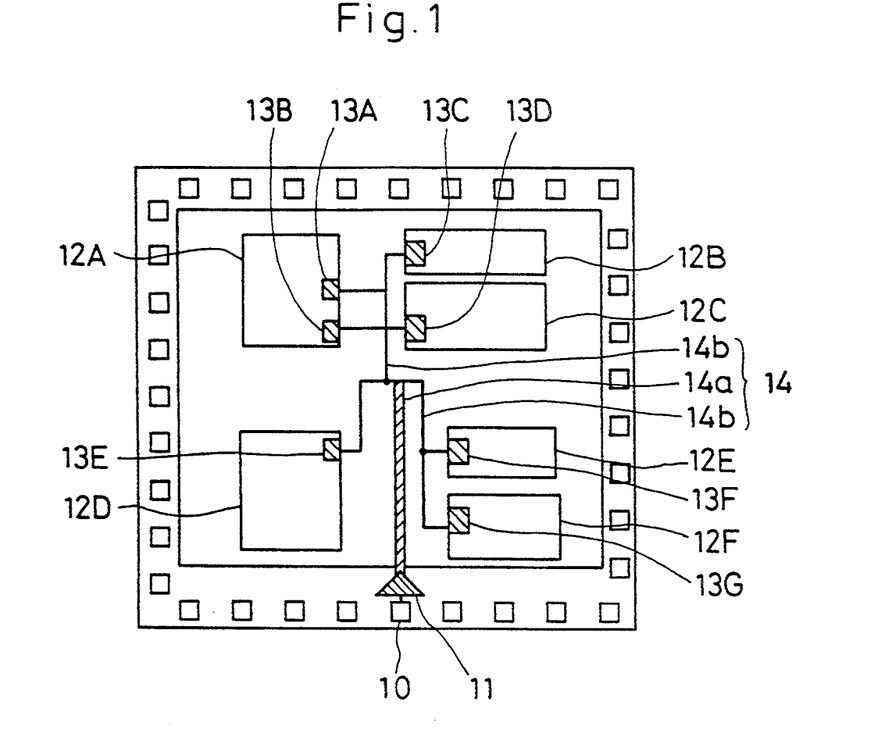
FIG. 1 is a schematic interconnect-wiring diagram of a semiconductor integrated circuit of a first embodiment of the present invention.

FIG. 1 outlines the interconnect-wiring of a semiconductor integrated circuit of a first embodiment of the invention. As shown in the figure, provided on the periphery of a semiconductor chip is a clock input pad 10. A clock driver 11 locates next to the clock input pad 10, which sends out clock signals. The clock driver 11 is fed power from the clock input pad 10. Since the clock driver 11 locates near the clock input pad 10, this assures a stable power supply to the clock driver 11 thereby making other active elements free from noises.

Formed on the semiconductor chip are functional blocks 12A, 12B, 12C, 12D, 12E and 12F. The functional block 12A is provided with clock pulse generators 13A and 13B. The functional block 12B is provided with a clock pulse generator 13C. The functional block 12C is provided with a clock pulse generator 13D. The functional block 12D is provided with a clock pulse generator 13E. The functional block 12E is provided with a clock pulse generator 13F. The functional block 12F is provided with a clock pulse generator 13G. Because of the provision of the clock pulse generators 13A to 13G to the functional blocks 12A to 12F, power consumption by each individual clock pulse generator can be held low, thereby achieving a noise reduction.

A clock signal line 14, through which a clock signal output from the clock driver 11 is transmitted to the clock pulse generators 13A to 13G, is composed of a first clock line 14a which runs from the clock driver 11 to the center of a semiconductor chip A, and a plurality of second clock lines 14b branching from the leading end of the first clock line 14a at the center of the semiconductor ship A to extend to the clock pulse generators 13A to 13G, respectively. Here, design rules for the first clock line 14a are set so that it has a greater feature size than the second clock lines 14b. Further, the feature size of the first clock line 14a is more than twice that of other lines. Since the second clock lines 14b start branching from at the center of the semiconductor chip to extend to the functional blocks 12A to 12F respectively, all the second clock lines 14b have almost the same interconnect-wiring length. The clock skew between two of the functional blocks 12A to 12F can be reduced.

Figure 2:
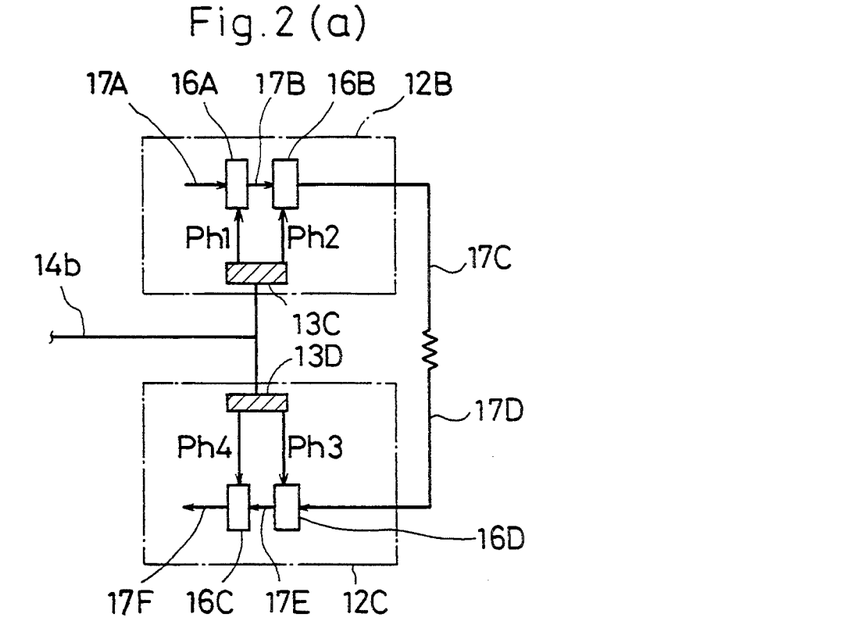
FIG. 2(a) shows an internal configuration of a functional block of the semiconductor integrated circuit of the first embodiment.
FIG. 2(b) shows how the semiconductor integrated circuit of the first embodiment reduces the clock skew.

FIG. 2 explains how the above-described semiconductor integrated circuit reduces the clock skew between functional blocks.

FIG. 2(a) illustrates the internal structure of the functional blocks 12B and 12C. In the figure, latches are indicated by reference numerals 16A, 16B, 16C, and 16D. Input data, input to the latch 16A, is indicated by reference numeral 17A. Output data, output from the latch 16A, is indicated by reference numeral 17B, and the latch 16B is fed the output data 17B. Output data, output from the latch 16B, is indicated by reference numeral 17C. Input data, input to the latch 16D, is indicated by reference numeral 17D. Output data, output from the latch 16D, is indicated by reference numeral 17E, and the latch 16C is fed the output data 17E. Output data, output from the latch 16C, is indicated by reference numeral 17F.

Owing to such an arrangement that the functional blocks 12B and 12C contain the clock pulse generators 13C and 13D respectively, both the lengths of signal lines Ph1 and Ph2 extending from the clock pulse generator 13C and the lengths of signal lines Ph3 and Ph4 extending from the clock pulse generators 13D shorten. This results in reducing the length difference between the signal lines Ph1 and Ph2 as well as the length difference between the signal lines Ph3 and Ph4. As a result, the clock skew within the functional blocks 12B and 12C is reduced.

The influence of the clock skew between the functional blocks 12B and 12C becomes weak, since the length of a data transmission line between the functional blocks 12B and 12C lengthens. FIG. 2(b) shows a data transition diagram with respect to an input clock Ph2 of the latch 16B and an input clock Ph3 of the latch 16D. In the figure, t1 indicates the amount of deviation between an input clock signal of the signal line Ph2 and an input clock signal of the signal line Ph3, ① and ② indicate the output data 17C transmitted from the latch 16B in the functional block 12B, ①' and ②' indicate the input data 17D transmitted into the latch 16D in the functional block 12C, and t2 indicates the amount of deviation between the data ①'. and the data ①'. Suppose that the amount of deviation between an input clock signal of the signal line Ph2 and an input clock signal of the signal line Ph3 is t1. In this case, if the output data 17C from the latch 16B is fed into the latch 16D with no phase transition, this results in the latch 16D latching wrong data, i.e., the data ②, in stead of the preceding data ① which should have been latched by the latch 16D. However, in a case where data transmission is made between functional blocks, the data ① is deviated from the data ①' by t2, and thus the latch 16D operates normally if t1 < t2.

Figure 3:
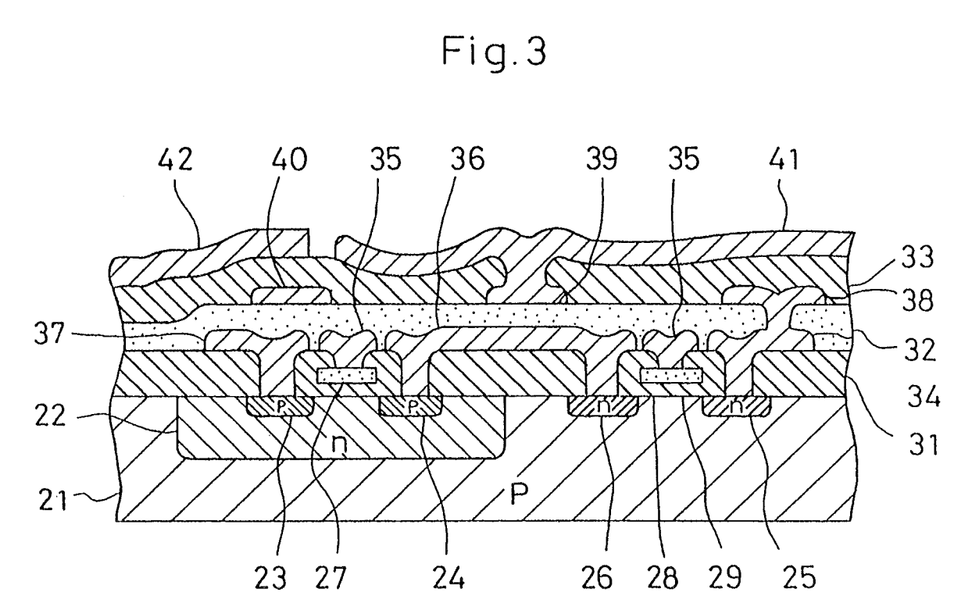
FIG. 3 shows in cross section a semiconductor integrated circuit of each of a second to a fifth embodiment.

FIG. 3 illustrates in cross section a semiconductor integrated circuit of each of a second embodiment to a fifth embodiment. In the figure, an N-type well region 22 is formed on top of a P-type semiconductor substrate 21. Formed on top of the N-type well region 22 are P-type regions 23 and 24. N-type regions 25 and 26 are locally formed on the remaining top area of the P-type semiconductor substrate 21, that is, they are formed on an area which is not occupied by the N-type well region 22. Gate electrodes 28 and 29 overlie the P-type semiconductor substrate 21. A first dielectric layer 29 is formed on the gate electrodes 28 and 29. First-aluminum interconnect-wirings 34, 35, 36, and 37 of a first-level layer are formed on the first dielectric layers 29 and 31, which are connected to the P-type regions 23 and 24, and to the N-type regions 25 and 26. Second aluminum interconnect-wirings 38, 39, and 40 of a second-level layer are formed over the first aluminum interconnect-wirings 34, 35, 36, and 37, with a second dielectric layer 32 intervened between the first aluminum interconnect-wirings and the second aluminum interconnect-wirings. Third aluminum interconnect-wirings 41 and 42 are formed over the second aluminum interconnect-wirings 38, 39, and 40, with a third dielectric layer 32 intervened between the second aluminum interconnect-wirings and the third aluminum interconnect-wirings.

Figure 4:
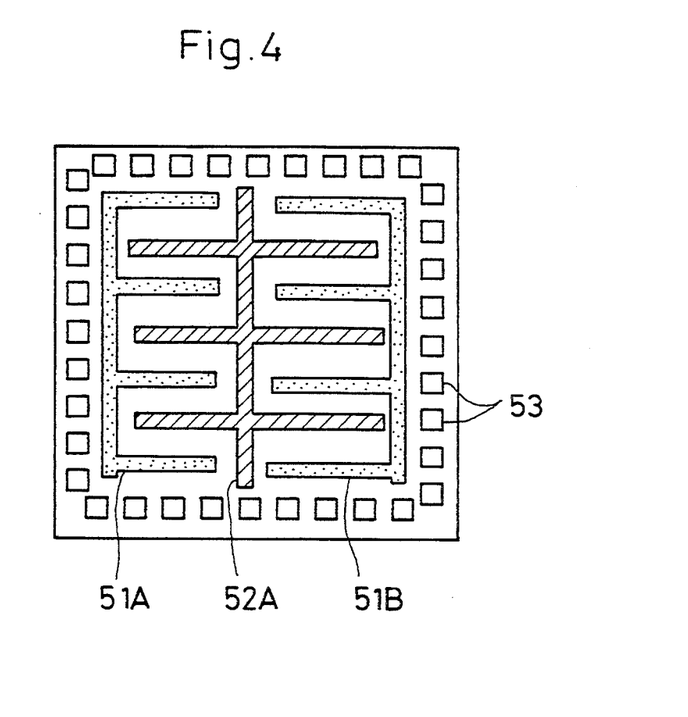
FIG. 4 is a schematic interconnect-wiring diagram of a third-level metal interconnect-wiring layer of the semiconductor integrated circuit of the second embodiment.

FIG. 4 shows the interconnect-wiring of a third-level layer of a semiconductor integrated circuit of the second embodiment. For ease of description, a case where a three-level aluminum interconnect-wiring layer is employed is explained.

In FIG. 4, $V_{DD}$ power supply lines are indicated by reference numerals 51A and 51B. A clock signal line is indicated by reference numeral 52A. An external input pad is indicated by reference numeral 53.

A first-level metal interconnect-wiring layer and a second-level metal interconnect-wiring layer are, too, provided with $V_{DD}$ power supply lines. These $V_{DD}$ power supply lines of the first- and second-level metal interconnect-wiring layers are connected to the $V_{DD}$ power supply lines 51A and 51B of the third-level layer through via holes. The $V_{DD}$ power supply lines 51A and 51B of the third-level layer are given greater design rules for lines and spaces as compared to those of the first- and second-level layers. The $V_{DD}$ power supply lines of the first- and second level layers are connected to the wider $V_{DD}$ power supply lines 51A and 51B of the third-level layer, as a result of which the supply of power is stabilized.

The clock signal line 52A is connected to an output of a clock driver and to a clock pulse generator of each functional block of a lower-level layer, through via holes.

Figure 5:
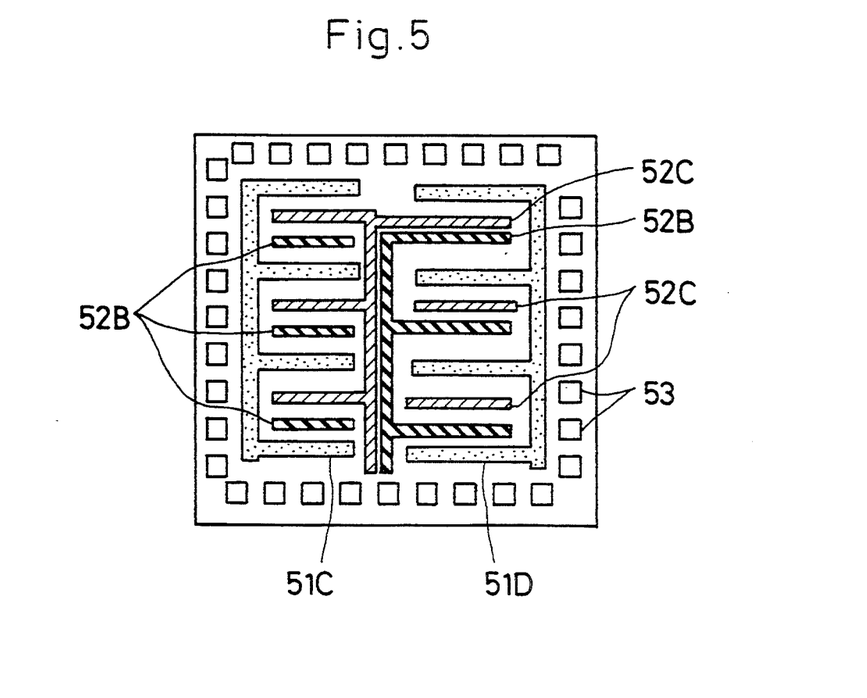
FIG. 5 is a schematic interconnect-wiring diagram of a third-level metal interconnect-wiring layer of the semiconductor integrated circuit of the third embodiment.

FIG. 5 shows interconnect-wirings of a third-level layer of a semiconductor integrated circuit of the third embodiment. For ease of description, a case where a three-level aluminum interconnect-wiring layer is employed is explained.

In FIG. 5, $V_{DD}$ power supply lines are indicated by reference numerals 51C and 51D. A first clock signal line is indicated by reference numeral 52B. A second clock signal line is indicated by reference numeral 52C. An external input pad is indicated by reference numeral 53.

Like the second embodiment, a first-level metal interconnect-wiring layer and a second-level metal interconnect-wiring layer are, too, provided with $V_{DD}$ power supply lines. These $V_{DD}$ power supply lines of the first- and second-level metal interconnect-wiring layers are connected to the $V_{DD}$ power supply lines 51C and 51D through via holes. The $V_{DD}$ power supply lines 51C and 51D of the third-level layer are given greater design rules for lines and spaces as compared to those of the first- and second-level layers. The $V_{DD}$ power supply lines of the first- and second-level layers are connected to the wider $V_{DD}$ power supply lines 51C and 51D of the third-level layer, as a result of which the supply of power is stabilized.

Figure 6:
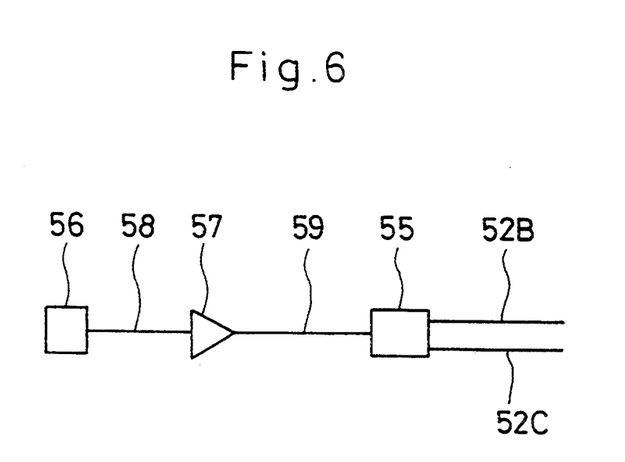
FIG. 6 is a schematic interconnect-wiring diagram illustrating a first and second clock signal lines of the semiconductor integrated circuit of the third embodiment.

As shown in FIG. 6, the first and second clock signal lines 52B and 52C are connected to two-layer outputs of a clock pulse generator 55 and to a clock signal feed destination of each functional block of a lower-level layer through via holes. A clock signal feed destination is supplied with two-layer clock signals through the first and second clock signal lines 52B and 52C.

In addition to the first and second clock signal lines 52B and 52C and the clock pulse generator 55, FIG. 6 shows an external input pad 56, an external clock signal 58, a clock driver 57, and a clock signal 59. The external clock signal 58 enters the external input pad 56, thereafter advancing to the clock driver 57. The clock driver 57 then amplifies the external clock signal 58 so as to generate the clock signal 59 and thereafter the clock signal 59 thus generated is fed to the clock pulse generator 55.

Figure 7:
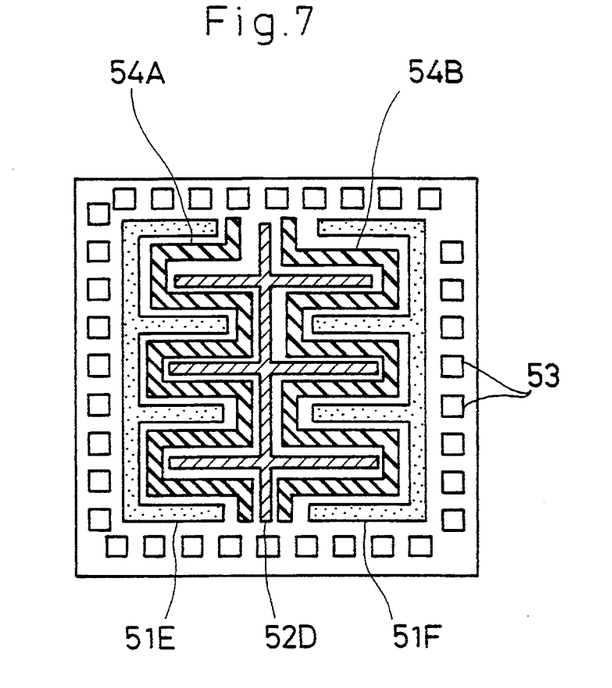
FIG. 7 is a schematic interconnect-wiring diagram of a third-level metal interconnect-wiring layer of the semiconductor integrated circuit of the fourth embodiment.

FIG. 7 shows interconnect-wirings of a third-level layer of a semiconductor integrated circuit of the fourth embodiment. For ease of description, a case where a three-level aluminum interconnect-wiring layer is employed is explained.

In FIG. 7, $V_{DD}$ power supply lines are indicated by reference numerals 51E and 51F. $V_{SS}$ power supply lines are indicated by reference numerals 54A and 54B. A clock signal line is indicated by reference numeral 52D. An external input pad is indicated by reference numeral 53.

A first-level metal interconnect-wiring layer and a second-level metal interconnect-wiring layer are, too, provided with $V_{DD}$ power supply lines. The $V_{DD}$ power supply lines and the $V_{SS}$ power supply lines of the first- and second-level metal interconnect-wiring layers are connected to the wider $V_{DD}$ and $V_{SS}$ power supply lines 51E, 51F, 54A and 54B of the third-level layer through via holes. As a result, the supply of power is stabilized.

The clock signal line 52D of the third-level layer is connected to an output of a clock driver and to a clock signal feed destination of each functional block of a lower-level layer underlying the third-level layer, through via holes.

Figure 8:
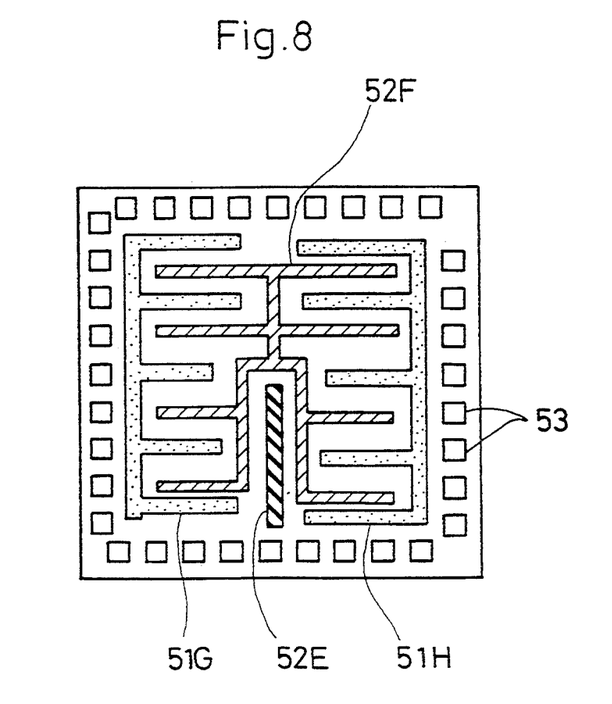
FIG. 8 is a schematic interconnect-wiring diagram of a third-level metal interconnect-wiring layer of the semiconductor integrated circuit of the fifth embodiment.

FIG. 8 shows the interconnect-wiring of a third-level layer of a semiconductor integrated circuit of the fifth embodiment. For ease of description, a case where a three-level aluminum interconnect-wiring layer is employed is explained.

In FIG. 8, $V_{DD}$ power supply lines are indicated by reference numerals 51G and 51H. A first clock signal line is indicated by reference numeral 52E. A second clock signal line is indicated by reference numeral 52F. An external input pad is indicated by reference numeral 53.

A first-level metal interconnect-wiring layer and a second-level metal interconnect-wiring layer are, too, provided with both of $V_{DD}$ and $V_{SS}$ power supply lines. The $V_{DD}$ power supply lines and the $V_{SS}$ power supply lines of the first- and second-level layers are connected to the wider $V_{DD}$ and $V_{SS}$ power supply lines 51E, 51F, 54A and 54B of the third-level layer through via holes. As a result, the supply of power is stabilized.

Figure 9:
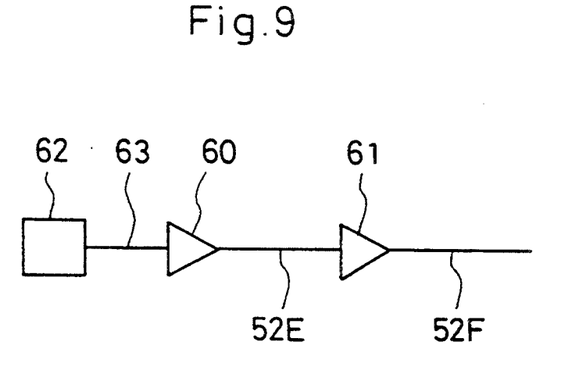
FIG. 9 is a schematic interconnect-wiring diagram illustrating a clock signal line of the semiconductor integrated circuit of the fifth embodiment.

As shown in FIG. 9, the first clock signal line 52E of the third-level layer is connected to an output of a clock driver 60 and to a clock pulse generator 61 of a lower-level layer underlying the third-level layer, through via holes. Clock signals are fed to the clock pulse generator 61 through the first clock signal line 52E. The second clock signal line 52F is connected to an output of the clock pulse generator 61 and to a clock signal feed destination of each functional block in the semiconductor chip, through via holes. Clock signals are fed through the second clock signal line 52F to each clock signal feed destination.

In FIG. 9, an external input pad is indicated by reference numeral 62 and an external clock signal, output from the external input pad 62, is indicated by reference numeral 63.

For the foregoing embodiments except for the first embodiment, the following are preferable design rules for lines and spaces available to a metal interconnect-wiring layer. Design rules for an uppermost-level metal interconnect-wiring layer are so set that they are about more than twice, more preferably more than five times those for a lower-level layer underlying the uppermost-level layer. Conventionally, a first-level layer is given design rules of a 0.8-micrometer feature size and a 0.8-micrometer line-to-line space, a second-level layer is given design rules of a 1.0-micrometer feature size and a 1.0-micrometer line-to-line space, and a third-level layer is given design rules of a 1.2-micrometer feature size and a 1.2-micrometer line-to-line space. However, it is preferable to set both a feature size and a line-to-line space of a third-level layer to above 20-micrometer. This means that a third-level layer has a clock signal line whose interconnect-wiring resistance value is one twentieth of that of a conventional clock signal line. This results in reducing the difference in interconnect-wiring resistance between functional blocks, thereby achieving a clock skew reduction.

In accordance with each of the second to fifth embodiments, a third-level metal interconnect-wiring layer is provided with power supply lines and clock signal lines only. This arrangement allows the third-level metal interconnect-wiring layer to employ greater design rules by which the feature size and line-to-line space can be set more than twice that of a lower-level metal interconnect-wiring layer underlying the third-level layer. Accordingly, the clock skew can be reduced. Further, when arranging clock signal lines, it is possible to give them priority of interconnect-wiring without being influenced by other signal lines, thereby making the interconnect-wiring lengths to all functional blocks equal. This further reduces the clock skew.

Since a power supply line is provided on an uppermost-level layer, this gives it a greater feature size. Power supply can be stabilized, accordingly.

Further, in accordance with the invention, power supply lines and clock signal lines, both of which are less applicable to being subjected to automated interconnect-wiring steps, are arranged on an uppermost-level layer which is also originally less applicable to being subjected to automated interconnect-wiring steps. This makes it possible to classify layers by step to distinguish an uppermost-level layer which is not subjected to automated interconnect-wiring steps from other lower-level layers which are subjected to automated interconnect-wiring steps. This simplifies automated interconnect-wiring processing.

The second to fifth embodiments each employ a three-level aluminum interconnect-wiring. However, this is not to be considered restrictive. Other metal materials may be used. The number of levels is not limited to three. Two or more level layer may be employed.

In the first, second and fourth embodiments, only $V_{DD}$ power supply lines serve as power supply lines, however, it is possible to provide $V_{SS}$ power lines instead of $V_{DD}$ power lines, or to provide both of them, like the third embodiment.

The invention claimed is:

1. A semiconductor integrated circuit comprising a plurality of functional blocks provided on a semiconductor chip and a multi-level metal interconnect-wiring layer, wherein:

particular one of said plurality of metal interconnect-wiring layers is for the exclusive use of a power supply line which delivers power to said plurality of functional blocks and a clock signal line through which a clock signal is transmitted to said plurality of functional blocks, and the minimum width of the lines on said particular metal interconnect-wiring layer is greater than the maximum width of lines on the remaining metal interconnect-wiring layers.

2. A semiconductor integrated circuit as in claim 1, wherein said particular metal interconnect-wiring layer is an uppermost-level layer in the semiconductor chip.

3. A semiconductor integrated circuit as in claim 2, wherein said particular metal interconnect-wiring layer is provided with no interconnect-wirings except for said power supply line and said clock signal line.

* * * * *